(12) United States Patent
Yamada

(10) Patent No.: US 10,931,206 B2
(45) Date of Patent: Feb. 23, 2021

(54) POWER SUPPLY FOR OUTPUT OF VARIOUS SPECIFICATIONS

(71) Applicant: FUJI ELECTRIC CO., LTD., Kanagawa (JP)

(72) Inventor: Ryuji Yamada, Hachioji (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/796,847

(22) Filed: Oct. 29, 2017

(65) Prior Publication Data

US 2018/0183351 A1 Jun. 28, 2018

(30) Foreign Application Priority Data

Dec. 27, 2016 (JP) .............................. JP2016-254516

(51) Int. Cl.
| | | |
|---|---|---|
| *H02M 7/00* | (2006.01) | |
| *H02M 5/44* | (2006.01) | |
| *H02M 7/06* | (2006.01) | |
| *H05K 1/16* | (2006.01) | |
| *H05K 1/02* | (2006.01) | |

(Continued)

(52) U.S. Cl.
CPC .............. *H02M 7/003* (2013.01); *H02M 5/44* (2013.01); *H02M 7/06* (2013.01); *H05K 1/0203* (2013.01); *H05K 1/165* (2013.01); *H05K 7/20909* (2013.01); *H02M 2001/008* (2013.01); *H02M 2001/0058* (2013.01); *H03H 7/38* (2013.01); *H05K 1/141* (2013.01); *H05K 3/366* (2013.01); *H05K 7/1427* (2013.01); *Y02B 70/10* (2013.01)

(58) Field of Classification Search
CPC .......... H02M 7/003; H02M 5/44; H02M 7/06; H02M 2001/0058; H02M 2001/008; H03H 7/38; H05K 1/0203; H05K 1/141; H05K 1/165; H05K 7/20909; H05K 7/1427; H05K 3/366; Y02B 70/10; Y02B 70/1491

See application file for complete search history.

(56) References Cited

U.S. PATENT DOCUMENTS 5,648,892 A * 7/1997 Wieloch ................ H02M 7/003
361/707
6,320,776 B1 * 11/2001 Kajiura ................. H02M 7/003
361/709

(Continued)

FOREIGN PATENT DOCUMENTS

| CN | 201435678 Y | 3/2010 |
|---|---|---|
| CN | 10203589 A | 4/2011 |

(Continued)

OTHER PUBLICATIONS

Office Action issued for counterpart Japanese Application No. 2016-254516, issued by the Japan Patent Office dated Sep. 1, 2020 (drafted on Aug. 25, 2020).

(Continued)

*Primary Examiner* — Shawki S Ismail
*Assistant Examiner* — Demetries A Gibson

(57) ABSTRACT

There is provided a power supply that includes a primary block having an inverter circuit and a secondary block connected to the primary block, the secondary block having a transformer with a primary side connected to the inverter circuit and having a rectifier that is connected to a secondary side of the transformer and outputs DC power.

14 Claims, 6 Drawing Sheets

(51) Int. Cl.
*H05K 7/20* (2006.01)
*H03H 7/38* (2006.01)
*H05K 7/14* (2006.01)
*H05K 1/14* (2006.01)
*H02M 1/00* (2006.01)
*H05K 3/36* (2006.01)

(56) References Cited

U.S. PATENT DOCUMENTS

| | | | | |
|---|---|---|---|---|
| 7,830,685 | B2* | 11/2010 | Wagner | H02M 3/285 363/17 |
| 2005/0052888 | A1* | 3/2005 | Takeshima | H02M 7/003 363/147 |
| 2005/0111245 | A1* | 5/2005 | Lai | H02M 5/293 363/125 |
| 2005/0270745 | A1* | 12/2005 | Chen | H01F 27/2804 361/707 |
| 2007/0152795 | A1* | 7/2007 | Zeng | H01F 27/2804 336/212 |
| 2009/0109709 | A1* | 4/2009 | Nakahori | H02M 3/285 363/16 |
| 2010/0302820 | A1 | 12/2010 | Nakamura | |
| 2011/0037405 | A1* | 2/2011 | Suganuma | H01F 27/2804 315/276 |
| 2011/0069514 | A1 | 3/2011 | Chiba | |
| 2011/0211369 | A1* | 9/2011 | Mulcahy | H02M 3/285 363/20 |
| 2012/0320638 | A1* | 12/2012 | Boysen | H02M 3/3376 363/21.02 |
| 2015/0270786 | A1* | 9/2015 | Chen | H02M 7/537 363/131 |
| 2017/0093299 | A1* | 3/2017 | Norimatsu | H02M 5/458 |
| 2017/0141694 | A1* | 5/2017 | Keister | H02M 1/08 |

FOREIGN PATENT DOCUMENTS

| | | |
|---|---|---|
| CN | 102077307 A | 5/2011 |
| CN | 102292904 A | 12/2011 |
| JP | H4-261361 A | 9/1992 |
| JP | H05-95672 A | 4/1993 |
| JP | H09322533 A | 12/1997 |
| JP | 2012-139003 A | 7/2012 |

OTHER PUBLICATIONS

Notice of First Office Action for Patent Application No. 201711017457.3, issued by the State Intellectual Property Office of the People's Republic of China dated Oct. 10, 2020.

* cited by examiner

POWER SUPPLY FOR OUTPUT OF VARIOUS SPECIFICATIONS

The contents of the following Japanese patent application are incorporated herein by reference:
NO. 2016-254516 filed in JP on Dec. 27, 2016.

BACKGROUND

1. Technical Field

The present invention relates to a power supply and simplification of structure of the power supply.

2. Related Art

Conventionally, multi-power supplies capable of supplying each of plural types of power have been developed (for example, see Patent Documents 1 to 3).
Patent Document 1: Japanese Patent Application Publication No. H5-95672
Patent Document 2: Japanese Patent Application Publication No. 2012-139003
Patent Document 3: Japanese Patent Application Publication No. H4-261361

However, with the conventional power supplies, output of various power specifications cannot be performed together with reduction of the manufacturing cost.

SUMMARY

An object of the technological innovation included herein is to provide a power supply, a primary block and a secondary block that can solve the above problem. The above and other objects can be achieved by combinations described in the claims. That is, a first aspect of the present invention provides a power supply that includes a primary block having an inverter circuit and a secondary block connected to the primary block, the secondary block having a transformer with a primary side connected to the inverter circuit and having a rectifier that is connected to a secondary side of the transformer and outputs DC power.

A second aspect of the present invention provides a primary block used in the power supply of the first aspect.

A third aspect of the present invention provides a secondary block used in the power supply of the first aspect.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims. Also, all the combinations of the features described in the embodiment(s) are not necessarily essential to means provided by aspects of the invention.

Figure 1:
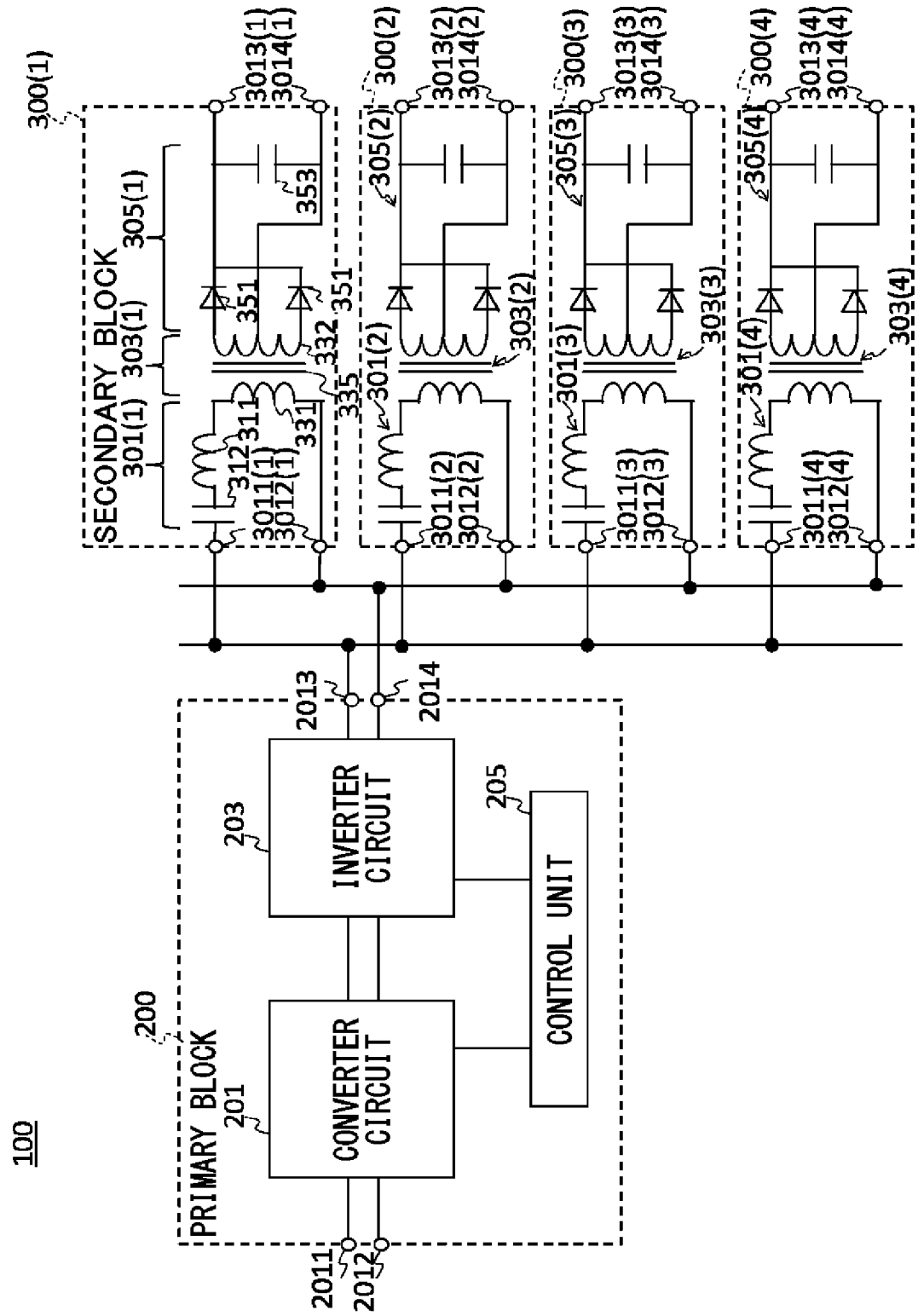
FIG. 1 shows a circuit structure of a power supply according to the present embodiment.

FIG. 1 shows a circuit structure of a power supply 100 according to the present embodiment. The power supply 100 outputs DC power of one type or plural types of voltage (such as 5 V, 12 V, and 24 V) and is connected to a computer, an ATM device, or the like, for example. The power supply 100 includes a primary block 200 and one or more secondary blocks 300 (four secondary blocks 300(1) through 300(4) as an example in the present embodiment) connected to the primary block 200.

The primary block 200 supplies AC power to the secondary block 300. In the present embodiment, as an example, the primary block 200 converts voltage, frequency, and the like of power that is supplied from an AC power supply (a single-phase 200V or 415V of a commercial power supply as an example) via an input terminal 2011 on one end side (U-phase side as an example) and an input terminal 2012 on the other end side (V-phase side as an example), and then supplies the converted power to the secondary block 300 from the output terminals 2013 and 2014. In the present embodiment, as an example, the rated power output of the primary block 200 is 1000 W. The primary block 200 has a converter circuit 201 and an inverter circuit 203 sequentially from the side of the input terminals 2011 and 2012 to the side of the output terminals 2013 and 2014. The primary block 200 may further have a control unit 205.

The converter circuit 201 converts a first AC power that is input from the input terminals 2011 and 2012, into a first DC power and supplies it to the inverter circuit 203. For example, the converter circuit 201 may be a diode rectifying circuit or a PFC (power factor correction) circuit.

The inverter circuit 203 converts DC voltage that is supplied from the converter circuit 201, into AC voltage and supplies it to the secondary block 300 from the output terminals 2013 and 2014. For example, the inverter circuit 203 may convert a first DC power output by the converter circuit 201 into a second AC power that has a higher frequency than the first AC power (100 kHz as an example) and supply it to the secondary block 300. In the present embodiment, as an example, the inverter circuit 203 may be a so-called I-type three-level power converting device.

Note that the inverter circuit 203 may have a switching element including a wide gap semiconductor. The wide gap semiconductor is a semiconductor that has a greater band gap than a silicon semiconductor and is also a semiconductor such as a SiC, GaN, diamond (C), AlN, AlGaN, or ZnO semiconductor, for example. By using the wide gap semiconductor, the switching speed of a switching element and thus the frequency of output power can be improved from 100 kHz to 1 MHz or the like.

The control unit 205 controls the converter circuit 201 and the inverter circuit 203. For example, the control unit 205 may control the converter circuit 201 and the inverter circuit 203 to adjust voltage, frequency, and the like of power output from the primary block 200.

The four secondary blocks 300(1) through 300(4) are connected to loads, respectively (the loads different from each other as an example), with inputs connected in parallel to the primary block 200 and with outputs insulated from each other by transformers 303 that are incorporated in the secondary blocks, respectively. At least one or some of the four secondary blocks 300(1) through 300(4) may be connected detachably to the primary block 200. Also, any number of secondary blocks 300 may be additionally connected to the primary block 200 to the extent that the number is feasible in terms of the structure. Each of the secondary blocks 300 rectifies AC power supplied from the primary block 200 via the input terminals 3011 and 3012. Also, each of the secondary blocks 300 converts the rectified power into power corresponding to a power specification of a load and outputs it from the output terminals 3013 and 3014. In the present embodiment, as an example, output voltage of each of the secondary blocks 300 is 12 V, 24 V, or the like, and each output power is for example, 250 W. Each of the secondary blocks 300 has an impedance matching circuit 301, a transformer 303, and a rectifier 305 sequentially from the side of the input terminals 3011 and 3012 to the side of the output terminals 3013 and 3014.

The impedance matching circuit 301 performs impedance matching between the inverter circuit 203 of the primary block 200 and the secondary block 300. For example, the impedance matching circuit 301 may be a series LC resonant circuit connected in series to a primary side of the transformer 303, and has a capacitor 311 and an inductor 312 that are connected in series. Alternatively, the impedance matching circuit 301 may be configured as an LLC resonant circuit that includes an exciting inductor of a primary winding 331 of the transformer 303, the capacitor 311, and the inductor 312. A resonant frequency of the impedance matching circuit 301 may be set based on a reference frequency of the inverter circuit 203, and is set to 105 kHz in the present embodiment, as an example, which is different from a reference frequency (100 kHz) of the inverter circuit 203. Note that resonant frequencies of at least some of the impedance matching circuits 301 in the plurality of secondary blocks 300 may be different from each other and may be set equal to a reference frequency of the inverter circuit 203.

In use of the foregoing impedance matching circuit 301, the impedance of the impedance matching circuit 301 becomes zero and AC voltage from the inverter circuit 203 is directly supplied to the transformer 303 in a case where the inverter circuit 203 supplies AC power of the resonant frequency. On the other hand, in a case where the inverter circuit 203 supplies AC power of a frequency different from the resonant frequency, the impedance of the impedance matching circuit 301 increases or decreases according to the frequency of the AC power, and then a voltage that has dropped due to this impedance is supplied to the transformer 303. That is, by adjusting the frequency of AC power output from the inverter circuit 203, the impedance of the impedance matching circuit 301 can be adjusted. As a result, the voltage transmission rate between the inverter circuit 203 and the secondary block 300 is adjusted, and even if input voltage of the inverter varies, operations such as keeping the output voltage of the secondary block 300 constant can be performed. Note that the impedance matching circuit 301 may not be included in the secondary block 300. In this case, AC power from the inverter circuit 203 is directly supplied to the transformer 303.

The transformer 303 is a converter with the primary side thereof (that is, the primary winding 331) connected to the inverter circuit 203 via the impedance matching circuit 301 and with the secondary side thereof (that is, a secondary winding 332) connected to the rectifier 305. The primary sides of the transformers 303(1) through 303(4) in the four secondary blocks 300(1) through 300(4) may be connected in parallel to the inverter circuit 203. A transformation ratio of the transformers 303 in the plurality of secondary blocks 300 may be different according to the power specification of a load connected to the secondary side. The transformer 303, which is in at least one secondary block 300, in each secondary block 300 in the present embodiment as an example, may have a core 335 shared by the primary winding 331 and the secondary winding 332.

The rectifier 305 is connected to the secondary side of the transformer 303 and outputs DC power from the output terminals 3013 and 3014. In the present embodiment, as an example, the rectifier 305 is a center-tapped full wave rectifying circuit. It has two diodes 351 the anodes of which are respectively connected to both ends of the secondary winding 332 of the transformer 303, and a capacitor 353 the positive electrode of which is connected to the cathodes of the two diodes 351.

The following describes operations of the power supply 100. If AC power is supplied to the input terminals 2011 and 2012 of the primary block 200, the converter circuit 201 converts the AC power into DC power and supplies it to the inverter circuit 203.

Then, the inverter circuit 203 converts DC voltage that is supplied from the converter circuit 201, into AC voltage and supplies it to the secondary blocks 300 from the output terminals 2013 and 2014.

Then, in each secondary block 300, the impedance matching circuit 301 varies the voltage based on the impedance attributable to the difference between the frequency of the AC power from the inverter circuit 203 and the resonant frequency of the impedance matching circuit 301.

Subsequently, after the transformer 303 transforms the AC voltage, the rectifier 305 rectifies the AC power to DC power and outputs it from the output terminals 3013 and 3014 of the secondary block 300.

Here, under the control of the control unit 205, the inverter circuit 203 may adjust the frequency of AC power to be supplied to the secondary blocks 300 according to the magnitude of DC power to be output by the secondary blocks 300. For example, the control unit 205 measures output voltage of any one of the secondary blocks 300 constantly or at reference time intervals. In a case where the measured voltage becomes higher or lower than a reference value, the frequency of AC power supplied to each of the secondary blocks 300 from the inverter circuit 203 may be set closer to the resonant frequency or further away from the resonant frequency. This lowers/increases the output voltage from the secondary blocks 300.

In the above-described power supply 100, each of the secondary blocks 300 having the transformer 303 and the rectifier 305 is connected to the primary block 200 having the inverter circuit 203, and therefore, overlapping of the inverter circuit 203 and the corresponding control circuit is prevented, compared to a case where the inverter circuit 203 is included in each secondary block 300. Thus, this can prevent increase in the size of the power supply 100 and in the manufacturing cost. Also, any number of the secondary blocks 300 can be installed or increased in the primary block 200 to an extent that the number is feasible in terms of the structure, and therefore, by installing or increasing the secondary blocks 300, output power can be easily adapted for the power specification of a load.

Also, the secondary block 300 has the impedance matching circuit 301 that performs impedance matching between a load and the inverter circuit 203, and therefore, by varying the output frequency of the inverter circuit 203, the output voltage from the secondary block 300 can be increased or decreased. Thus, regardless of increase or decrease in voltage supplied to the primary block 200, a constant voltage can be supplied to a load.

Also, the inverter circuit 203 has the switching element including the wide gap semiconductor, and therefore, the switching speed of the inverter circuit 203 can be increased. Thus, by the amount of reduction in magnetic flux (voltage× time) in the transformer 303 of the secondary block 300, the cross-sectional area of the transformer 303 can be made smaller and then the secondary block 300 is thereby downsized. Also, this can lower the cost of manufacturing the secondary blocks 300.

Figure 2:
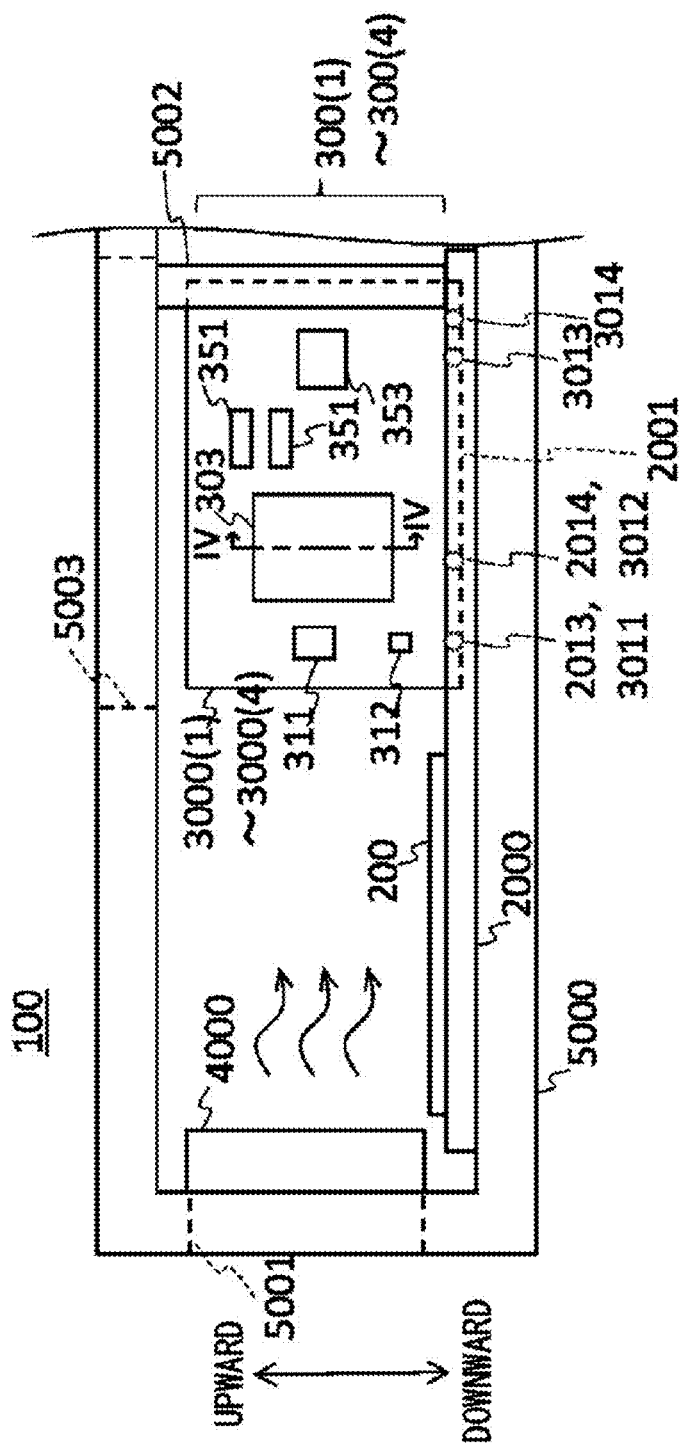
FIG. 2 shows the inside of the power supply according to the present embodiment.

FIG. 2 shows the inside of the power supply 100 according to the present embodiment. The power supply 100 may include a main substrate 2000, one or more sub-substrates 3000 (four sub-substrates 3000(1) through 3000(4) as an example in the present embodiment), a cooling unit 4000, and a housing 5000 for accommodating these elements.

The primary block 200 is provided on the main substrate 2000. For example, the main substrate 2000 may be a printed circuit board. A groove 2001 may be provided in the main substrate 2000 for fitting the sub-substrate 3000 therein. In this case, as an example, the output terminals 2013 and 2014 may be provided in the groove 2001. The main substrate 2000 may be fixed to the inner lower surface of the housing 5000.

The four secondary blocks 300 are provided on the four sub-substrates 3000, respectively. In the present embodiment, as an example, the impedance matching circuit 301, the transformer 303, and the rectifier 305 of the secondary block 300 are formed on one surface of each of the sub-substrates 3000. However, some of these elements may be formed on the one surface while the other elements may be formed on the other surface. In this case, the elements can be arranged on the both surfaces of the sub-substrate 3000, and therefore, sizes of the elements can be made larger, and the wiring can be simplified. Also, the sub-substrate 3000 can be downsized.

Each of the plurality of sub-substrates 3000 can be mounted to stand on the main substrate 2000. This enhances the efficiency in releasing heat from the sub-substrate 3000.

Here, in a case where the inverter circuit 203 has the switching element including the wide gap semiconductor as described above, the cross-sectional area of the transformer 303 can be reduced by increasing the switching speed of the inverter circuit 203. This reduces the weight of the transformer 303, and increases the mechanical strength of the sub-substrate 3000. Thus, a structure for supporting the sub-substrate 3000 can be simplified.

For example, the sub-substrate 3000 may be installed to stand on the main substrate 2000 with the bottom side fit into the groove 2001 of the main substrate 2000. In this case, as an example, the input terminals 3011 and 3012 of the secondary block 300 may be provided in positions contacting the output terminals 2013 and 2014 of the primary block 200 in the groove 2001. Also, the output terminals 3013 and 3014 of the secondary block 300 may be provided in positions contacting the groove 2001, and the output power from the secondary blocks 300 may be led to the outside of the housing 5000 via the wiring pattern (not shown in the drawing) on the main substrate 2000. Note that the output power of the secondary blocks 300 may be led directly to the outside of the housing 5000 without passing through the main substrate 2000.

The cooling unit 4000 passes cooling air through the inside of the housing 5000. For example, the cooling unit 4000 may be a cooling fan. The cooling unit 4000 may be installed on the inner surface of the housing 5000 to face the side of the plurality of sub-substrates 3000. In the present embodiment, as an example, the cooling unit 4000 is fixed to a side surface out of the inner surfaces of the housing 5000, the side surface facing the sub-substrate 3000. A slit 5001 communicating with the outside may be provided in a wall portion of the housing 5000, the wall portion on which the cooling unit 4000 is installed.

The housing 5000 may support at least one side of each of the plurality of sub-substrates 3000 other than the side that is attached to the main substrate 2000, in addition to or instead of the support of the sub-substrates 3000 by the groove 2001 in the main substrate 2000. This prevents vibration of the sub-substrate 3000 installed to stand on the main substrate 2000.

For example, the housing 5000 may have a rail member 5002 that extends from the top wall portion thereof, and a side of each of the sub-substrates 3000 (the farther side from the cooling unit 4000, as an example) may be engaged in the rail member 5002 to be supported. A slit 5003 may be provided in a top wall portion of the housing 5000. The slit 5003 is for inserting the sub-substrate 3000 along the rail member 5002 into the groove 2001 in the main substrate 2000.

Note that in the above description, the housing 5000 accommodates the main substrate 2000, the sub-substrate 3000, and the cooling unit 4000. However, it may not accommodate the cooling unit 4000. For example, the cooling unit 4000 may be installed outside the wall portion of the housing 5000, the wall portion in which the slit 5001 is provided. In addition to or instead of this, the housing 5000 may further accommodate at least one load that receives power supplied from the secondary blocks 300.

Figure 3:
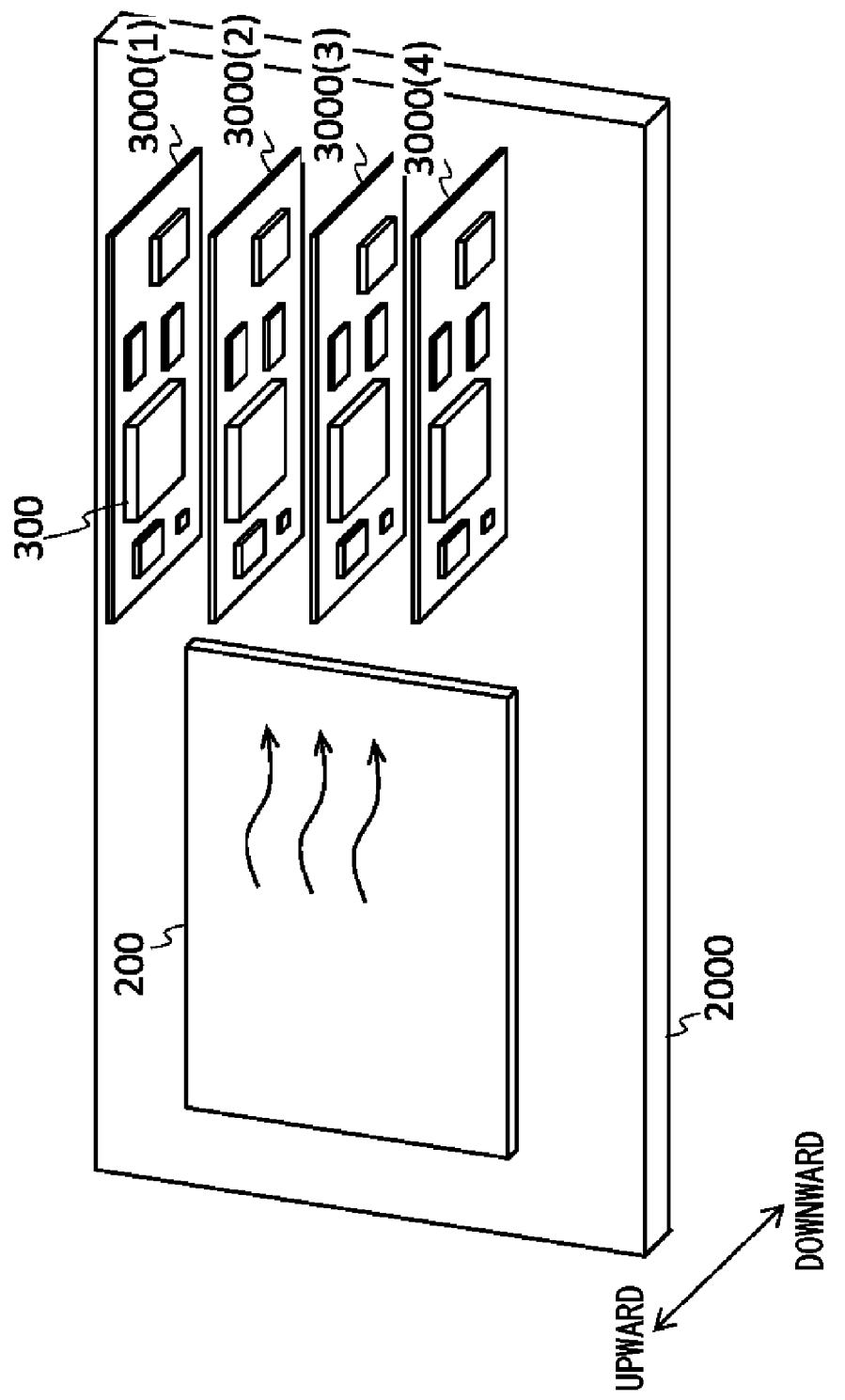
FIG. 3 shows a relation between a plurality of sub-substrates and cooling air.

FIG. 3 shows a relation between the plurality of sub-substrates 3000 and cooling air. The plurality of sub-substrates 3000 may be mounted in parallel to stand on the main substrate 2000, and the cooling unit 4000 may pass cooling air between the plurality of sub-substrates 3000. This allows each of the sub-substrates 3000 to be efficiently cooled.

Figure 4:
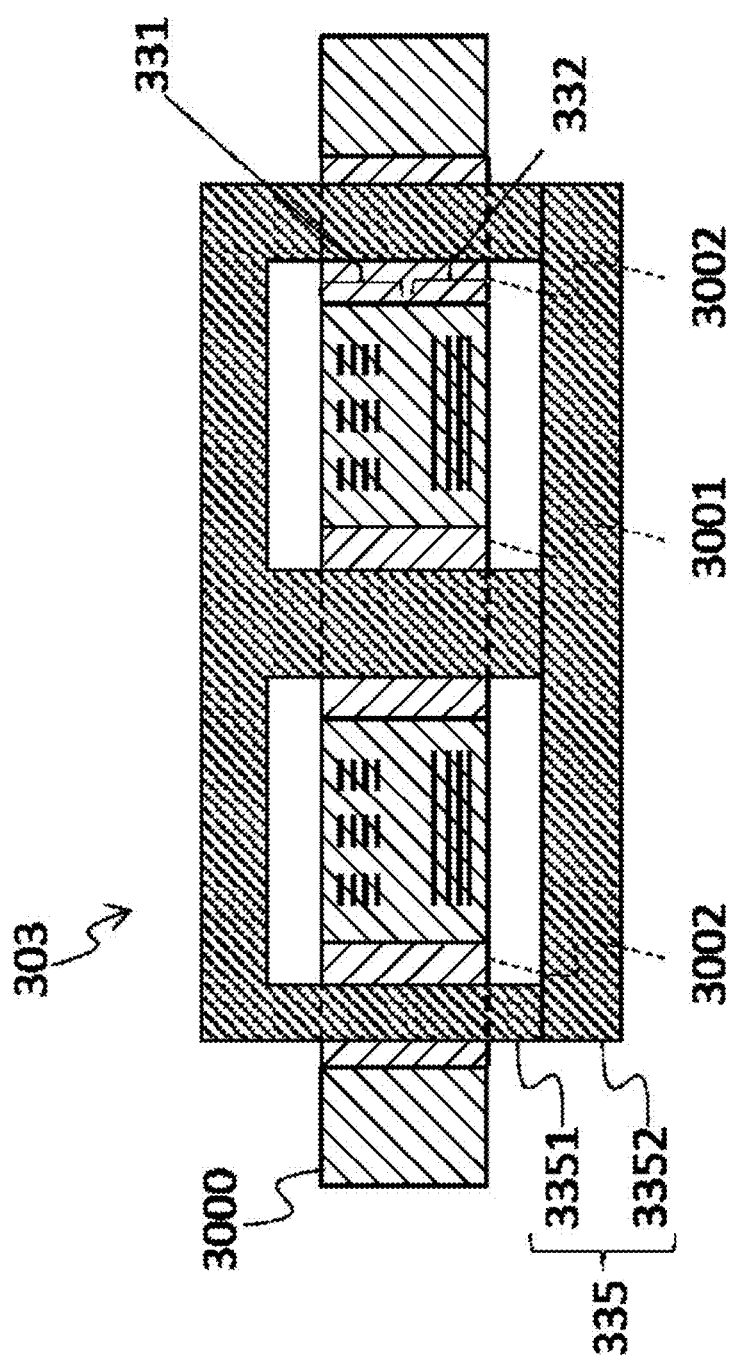
FIG. 4 shows a cross-section of a transformer.

FIG. 4 shows a cross-section of the transformer 303. In the transformer 303 of at least one of the four secondary blocks 300(1) through 300(4), at least one of the primary winding 331 and the secondary winding 332 may be a pattern coil formed in one or more layers of the sub-substrate 3000. In the present embodiment, as an example, the primary winding 331 and the secondary winding 332 are both pattern coils. Here, the pattern coil may be a winding formed in a wiring pattern on a printed board. For example, the pattern coil may be formed by alternately stacking a circular or polygonal wiring pattern and an insulating layer. By using the pattern coil as the winding of the transformer 303, the cost incurred from providing a plurality of secondary blocks 300 can be lowered, and increase in the size of the device can be prevented.

The number of wiring layers may be greater in the sub-substrate 3000 that is provided with the pattern coil out of the plurality of sub-substrates 3000 than in the main substrate 2000. In this way, the number of turns of the pattern coil increases. Also, by the amount of increase of the wiring patterns with a high thermal conductivity, the cooling efficiency in the transformer 303 and the rectifier 305 that are provided in the sub-substrate 3000 increases. Note that the number of wiring layers in the sub-substrate 3000 may be increased only in a region for forming the wiring patterns. In this case, the cost of manufacturing the sub-substrates 3000 can be lowered.

The core 335 may be inserted into a through hole 3001 provided in a central portion of the pattern coil in the sub-substrate 3000. For example, the core 335 may have an iron core 3351 having an E-shape as seen from the side and an iron core 3352 having a pillar shape. The iron core 3351 may be connected to a side surface of the iron core 3352 at the end portions thereof, being inserted into the through hole 3001 provided in the central portion of the pattern coil and being inserted into two through holes 3002. The two through holes 3002 are provided respectively in one side portion and in the other side portion of the pattern coil with respect to the through hole 3001.

Figure 5:
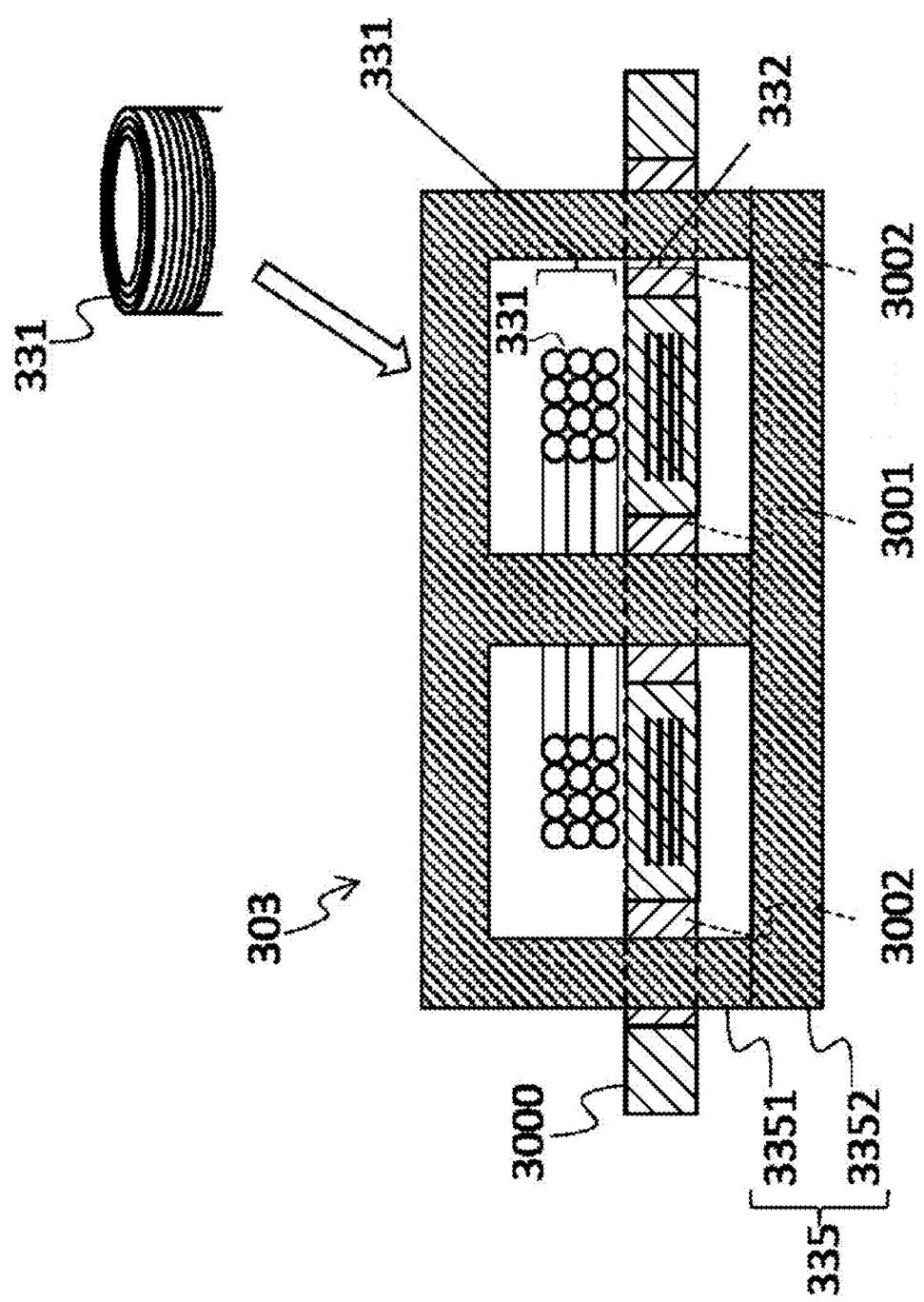
FIG. 5 shows a cross-section of a transformer of a modification example.

FIG. 5 shows a cross-section of the transformer 303 of a modification example. In addition to or instead of the example shown in FIG. 4, in the transformer 303 of at least one of the secondary blocks 300, one of the primary winding 331 and the secondary winding 332 may be the pattern coil formed in the one or more layers of the sub-substrate 3000, and the other may be a coil component mounted on a surface of the sub-substrate 3000. Here, the coil component may be a winding formed by winding an electric wire. The coil component may have a cylindrical shape or a polygonal and tubular shape. In a case where the windings are the pattern coils, the number of turns per layer is limited in the sub-substrate 3000 due to limitation given by the allowable minimum width of and allowable minimum space between the conductors. Therefore, the number of layers needs to be increased in order to secure the number of turns. In contrast, in a case where one of the windings is the pattern coil and the other is the coil component, the number of layers in the sub-substrate 3000 is decreased more than in the case where both of the windings are pattern coils.

In the present embodiment, as an example, the primary winding 331 is the coil component, and the secondary winding 332 is the pattern coil. The number of turns of the pattern coil may be less than the number of turns of the coil component. In this case, the number of turns can be increased on the primary side where voltage is high and current is small. In a case where the transformer 303 using the coil component has the core 335 shared by the pattern coil and the coil component, a winding that has been processed in advance to have a tubular shape is prepared. Then, the transformer 303 may be formed by inserting the core 335 into a hole part of the coil component and the through hole 3001 provided in the central portion of the pattern coil.

Note that in the above-described embodiment, it has been described that the power supply 100 has the four secondary blocks 300 on the four sub-substrates 3000, respectively. However, at least one of the plurality of secondary blocks 300 may be provided on each of the plurality of sub-substrates 3000. For example, the plurality of secondary blocks 300 may be provided on at least one of the sub-substrates 3000. In a case where two of the secondary blocks 300 are provided on the sub-substrate 3000, these secondary blocks 300 may be provided respectively on both surfaces of the sub-substrate 3000.

Also, in the above description, the primary block 200 has the converter circuit 201 and the inverter circuit 203. However, it may not have the converter circuit 201. In this case, the primary block 200 may convert input DC power into AC power at the inverter circuit 203 and supply it to the secondary blocks 300.

Also, in the above description, the power supply 100 includes the cooling unit 4000 and the housing 5000. However, it may not include one or both of them.

Also, various embodiments according to the present invention may be described with reference to flow charts and block diagrams. Blocks herein may illustrate (1) steps of processes of executing operations or (2) sections in a device responsible for executing operations. Particular steps and sections may be implemented by a dedicated circuitry, a programmable circuitry that is supplied together with computer-readable instructions stored on a computer-readable medium, and/or by a processor that is supplied together with computer-readable instructions stored on a computer-readable medium. The dedicated circuitry may include digital and/or analog hardware circuits. It may also include integrated circuits (IC) and/or discrete circuits. The programmable circuitry may include reconfigurable hardware circuits that include a logical AND, a logical OR, a logical XOR, a logical NAND, a logical NOR, other logical operations, a flip-flop, a register, and memory elements such as a field-programmable gate array (FPGA) and a programmable logic array (PLA).

The computer-readable medium may include any tangible device that can store instructions to be executed by an appropriate device. As a result, the computer-readable medium having the instructions stored on the device incorporates a product including instructions that can be executed in order to create means for executing operations specified in the flow charts or the block diagrams. Examples of the computer-readable medium may include: an electronic storage medium; a magnetic storage medium; an optical storage medium; an electromagnetic storage medium; and a semiconductor storage medium. More specific examples of the computer-readable medium may include: a floppy (registered mark) disk; a diskette; a hard disk; a random access memory (RAM); a read-only memory (ROM); an erasable programmable read-only memory (EPROM or flash memory); an electrically erasable programmable read-only memory (EEPROM); a static random access memory (SRAM); a compact disk read-only memory (CD-ROM); a digital versatile disk (DVD); a BLU-RAY (registered mark) disk; a memory stick; and an integrated circuit card.

The computer-readable instructions may include: assembler instructions; instruction set architecture (ISA) instructions; machine instructions; machine-dependent instructions; microcodes; firmware instructions; state setting data, or a source code or an object code written in one of or any combination of a plurality of programming languages, the programming language(s) including object-oriented programming language such as Smalltalk (registered mark), JAVA (registered mark), and C++; and a conventional procedural programming language such as 'C' programming language or a similar programming language.

The computer-readable instruction may be provided to a processor of general purpose computer, a special purpose computer, another programmable a data-processing device, or to a programmable circuitry, locally, via local area network (LAN), or wide area network (WAN) such as the Internet. The computer-readable instruction may be executed in order to create means for executing operations specified by the flow charts or block diagrams. Examples of the processor include: a computer processor; a processing unit; a microprocessor; a digital signal processor; a controller; and a microcontroller.

Figure 6:
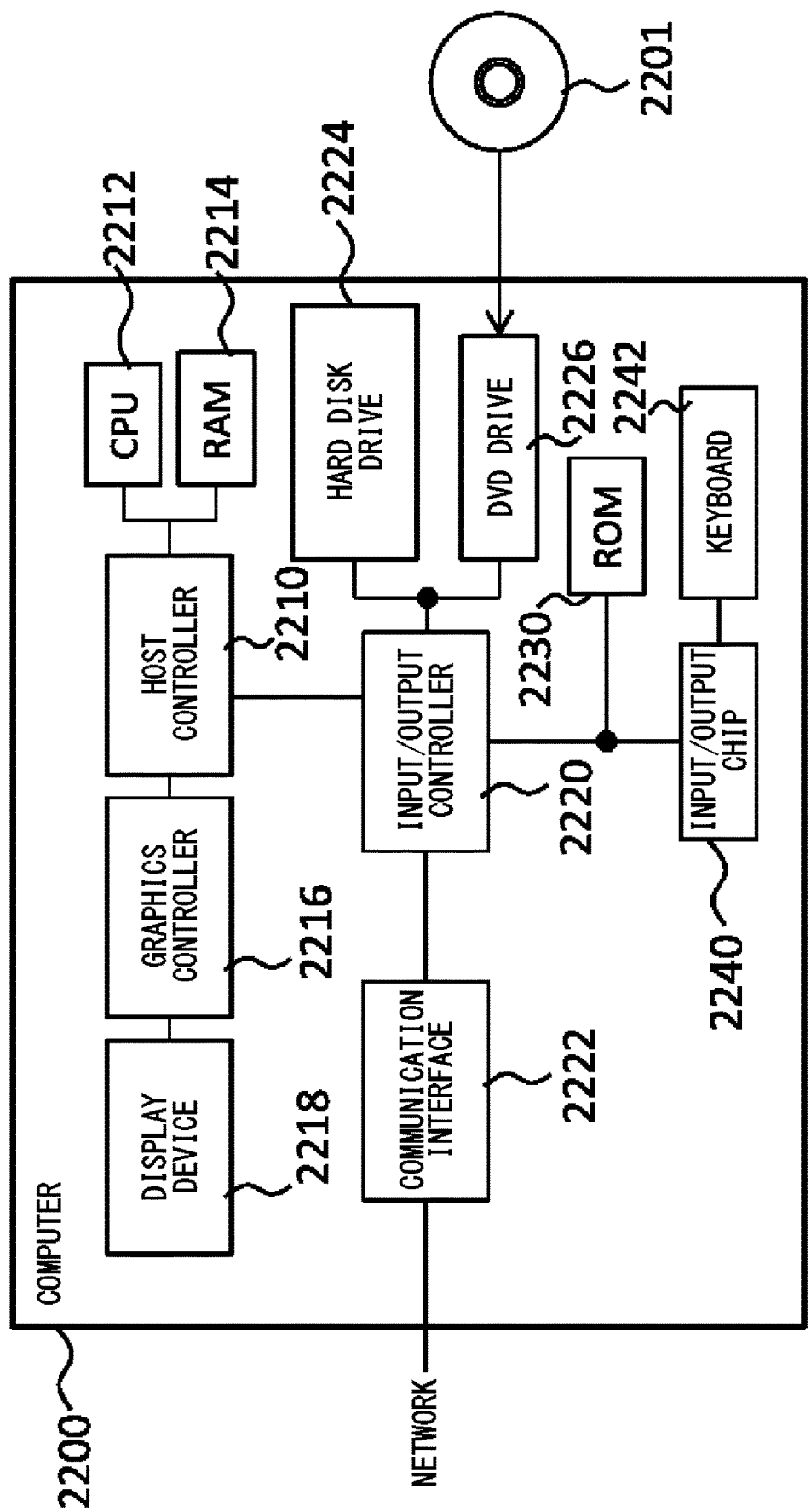
FIG. 6 shows an exemplary configuration of a computer according to the present embodiment.

FIG. 6 shows an exemplary computer 2200 in which a plurality of aspects of the present invention may be embodied wholly or partially. One or more programs installed on a computer 2200 can cause the computer 2200: to function as operations associated with a device according to (an) embodiment(s) of the present invention or as one or more sections of the device; or to execute the operation or the one or plurality of sections; and/or to execute a process according to the embodiment(s) of the present invention or steps of the process. Such programs may be executed by a CPU 2212 in order to cause the computer 2200 to execute particular operations associated with some or all of the flow charts and the blocks of the block diagrams described herein.

The computer 2200 according to the present embodiment includes the CPU 2212, a RAM 2214, a graphics controller 2216, and a display device 2218, and they are connected to each other with a host controller 2210. The computer 2200 also include input/output units such as a communication interface 2222, a hard disk drive 2224, a DVD-ROM drive 2226, and an IC card drive, and they are connected to the host controller 2210 via an input/output controller 2220. The computer also includes legacy input/output units such as a ROM 2230 and a keyboard 2242, and they are connected to the input/output controller 2220 via an input/output chip 2240.

The CPU 2212 operates according to programs stored in the ROM 2230 and the RAM 2214 and thereby controls each unit. The graphics controller 2216 acquires image data generated by the CPU 2212 on a frame buffer or the like provided in the RAM 2214, or in the graphics controller 2216, to display the image data on the display device 2218.

The communication interface 2222 communicates with another electronic device via network. The hard disk drive 2224 stores programs and data used by the CPU 2212 in the computer 2200. The DVD-ROM drive 2226 reads out programs or data from a DVD-ROM 2201 and provides the programs or data to the hard disk drive 2224 via the RAM 2214. The IC card drive reads out programs and data from an IC card and/or writes programs and data into the IC card.

The ROM 2230 stores therein a boot program and the like to be executed by the computer 2200 at the time of activation and/or a program that depends on hardware of the computer 2200. The input/output chip 2240 may also connect various input/output units to the input/output controller 2220 via a parallel port, a serial port, a keyboard port, a mouse port, or the like.

Programs are provided by a computer-readable medium such as the DVD-ROM 2201 or the IC card. The programs are read out from the computer-readable medium and installed on the hard disk drive 2224, the RAM 2214, or the ROM 2230, which are also examples of the computer-readable medium, to be executed by the CPU 2212. The information processing described in these programs is read out by the computer 2200 to provide linkage between the programs and the above-described various types of hardware resources. The devices or the methods may be constituted by implementing operations or processing of information in accordance with usage of the computer 2200.

For example, in a case where communication is executed between the computer 2200 and an external device, the CPU 2212 may execute a communication program loaded into the RAM 2214 and instructs the communication interface 2222 to implement the communication processing according to processing described in the communication program. Under control of the CPU 2212, the communication interface 2222 reads out transmission data stored in a transmission buffer processing region provided in a recording medium such as the RAM 2214, the hard disk drive 2224, the DVD-ROM 2201, or the IC card, and then sends the read transmission data to network or writes data received from the network into a reception buffer processing region provided in the recording medium or the like.

Also, the CPU 2212 may operate such that all or a necessary portion of a file or database stored on an external recording medium such as the hard disk drive 2224, the DVD-ROM drive 2226 (DVD-ROM 2201) or the IC card is read by the RAM 2214. Then, it may execute various types of processing on data in the RAM 2214. The CPU 2212 subsequently writes back the processed data to the external recording medium.

Various types of information such as various types of programs, data, tables, and databases may be stored on a recording medium, and then information processing may be performed on the information. On data read out from the RAM 2214, the CPU 2212 may execute various types of processing which include various types of operations, information processing, conditional judgement, conditional branch, unconditional branch, information searching/replacement, and the like as described throughout in the disclosure herein or specified by instruction sequences of programs. Then, the CPU 2212 writes back the result into the RAM 2214. Also, the CPU 2212 may search for information in files, database, or the like in a recording medium. For example, in a case where a recording medium stores a plurality of entries each having an attribute value of a first attribute associated with an attribute value of a second attribute, the CPU 2212 may search an entry, out of the plurality of entries, that has an attribute value of the first attribute matching a specified condition. Then, the CPU 2212 may read out an attribute value of the second attribute stored in the entry and acquire the attribute value of the second attribute associated with the first attribute that satisfies the predetermined condition.

The above-described programs or the software modules may be stored in a computer-readable medium in or near the computer 2200. Also, a recording medium such as a hard disk or a RAM provided in a server system that is connected to a dedicated communication network or the Internet can be used as the computer-readable medium, whereby a program is provided to the computer 2200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As apparent from the above description, according to one embodiment of the present invention, output of various power specifications can be performed while the manufacturing cost is lowered.

What is claimed is:

1. A power supply comprising:
   a main substrate having an inverter circuit; and
   a plurality of sub-substrates each electrically connected to the main substrate and each mounted perpendicular on edge to the main substrate, each of the plurality of sub-substrates having a transformer with a primary coil electrically connected to the inverter circuit and having a rectifier that is electrically connected to a secondary coil of the transformer and that outputs DC power, wherein
   the primary coil of the transformer in each of the plurality of sub-substrates are electrically connected in parallel to the inverter circuit, each of the plurality of sub-substrates, together with the transformer and the rectifier therein as a single block, is detachably mounted perpendicular on the main substrate, in the transformer of at least one of the plurality of sub-substrates, at least one of the primary coil and the secondary coil is a pattern coil formed in one or more layers of the at least one of the plurality of sub-substrates, and the other of the primary coil and the secondary coil is a wound coil component that is mounted on a surface of the at least one of the plurality of sub-substrates and formed by a wound electric wire.

2. The power supply according to claim 1, wherein the impedance matching circuit is a series LC resonant circuit.

3. The power supply according to claim 1, further comprising a housing that accommodates the main substrate and the plurality of sub-substrates, wherein the housing supports at least one side of each of the plurality of sub-substrates other than a side of the respective one of the plurality of sub-substrates that is mounted to the main substrate.

4. The power supply according to claim 1, wherein the plurality of sub-substrates are mounted in parallel to stand perpendicular on a side on the main substrate, the power supply further comprising a cooling unit that passes cooling air between the plurality of sub-substrates.

5. The power supply according to claim 1, wherein a number of wiring layers is greater in the at least one sub-substrate provided with the pattern coil out of the plurality of sub-substrates than in the main substrate.

6. The power supply according to claim 1, wherein in the transformer of at least one of the sub-substrates, the primary coil is the wound coil component, and
the secondary coil is the pattern coil.

7. The power supply according to claim 1, wherein a number of turns of the pattern coil is less than a number of turns of the wound coil component.

8. The power supply according to claim 1, wherein the at least one of the sub-substrates has a core shared by the pattern coil and the wound coil component, and the core is inserted into a through hole provided in a central portion of the pattern coil in the at least one sub-substrate.

9. The power supply according to claim 1, wherein the main substrate comprises a converter circuit that converts a first AC power into a first DC power, wherein the inverter circuit converts the first DC power output by the converter circuit into a second AC power that has a higher frequency than the first AC power and then supplies the second AC power to the plurality of sub-substrates.

10. The power supply according to claim 1, wherein the inverter circuit adjusts frequency of AC power to be supplied to the plurality of sub-substrates according to magnitude of DC power to be output by any one of the plurality of sub-substrates.

11. The power supply according to claim 1, wherein the rectifier of at least one of the plurality of sub-substrates outputs DC power having a different power specification than at least one other of the plurality of sub-substrates; and each of the plurality of sub-substrates is detachably mounted on the main substrate such that each of the plurality of sub-substrates is interchangeable with each other sub-substrate, each of the plurality of sub-substrates having a different power specification.

12. The power supply according to claim 11, wherein each of the plurality of sub-substrates is detachably mounted on the main substrate at one of a plurality of mount positions;

each of the plurality of mount positions includes a plurality of output terminals; and each of the plurality of sub-substrates includes a plurality of input terminals, each of the plurality of input terminals having positional correspondence to one of the plurality of output terminals of a corresponding one of the plurality of mount positions.

13. The power supply according to claim 12, wherein each of the plurality of mount positions includes a groove in the main substrate.

14. The power supply according to claim 13, wherein the plurality of input terminals of each of the plurality of sub-substrates contact the respective plurality of output terminals provided in the groove of each of the plurality of mount positions in the main substrate.

* * * * *